(12) United States Patent
Li et al.

(10) Patent No.: US 12,354,567 B2
(45) Date of Patent: Jul. 8, 2025

(54) DRIVING METHOD OF DISPLAY PANEL, DISPLAY PANEL, AND DISPLAY DEVICE

(71) Applicant: HKC CORPORATION LIMITED, Shenzhen (CN)

(72) Inventors: Yao Li, Shenzhen (CN); Junfeng Xie, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/631,066

(22) Filed: Apr. 10, 2024

(65) Prior Publication Data
US 2025/0006152 A1    Jan. 2, 2025

(30) Foreign Application Priority Data
Jun. 29, 2023  (CN) .......... 202310785740.X

(51) Int. Cl.
*G09G 3/38*        (2006.01)
*G02F 1/163*       (2006.01)
(Continued)

(52) U.S. Cl.
CPC ........... *G09G 3/38* (2013.01); *G02F 1/163* (2013.01); *G09G 3/035* (2020.08); *H10K 59/50* (2023.02);
(Continued)

(58) Field of Classification Search
CPC  G09G 3/19; G09G 3/38; G09G 3/035; G09G 3/30–3291; G09G 2300/46; G09G 2300/0465; G09G 2320/0233; G09G 2320/0295; G02F 1/163; H10K 59/50; H10K 59/80515; H10K 59/8792; H10K 77/111
See application file for complete search history.

(56) References Cited

U.S. PATENT DOCUMENTS

2013/0021561 A1    1/2013  Ahn
2015/0286091 A1*  10/2015  Zhang ............... G02F 1/163
                                                 359/275
(Continued)

FOREIGN PATENT DOCUMENTS

CN         105576006 A     5/2016
CN         107807484 A     3/2018
(Continued)

*Primary Examiner* — Hang Lin

(57) ABSTRACT

A driving method of a display panel, a display panel, and a display device are disclosed. The display panel includes an organic light-emitting layer and a filter disposed on a light-exit surface thereof. Corresponding to each pixel area, the filter includes a color filter and a first and second electrochromic layer that are disposed on both sides of the color filter. The driving method includes: detecting a current state of the display panel; when in a stretched state, controlling the first and the second electrochromic layer to each become a filter layer having the same color as the corresponding color filter; when in an unstretched state, controlling the first and the second electrochromic layer to become opaque, where the first and the second electrochromic layer may change into the same color as the color filter or into black color or transparent under the action of an electric field.

20 Claims, 8 Drawing Sheets

(51) Int. Cl.
  *G09G 3/00*   (2006.01)
  *H10K 59/50*  (2023.01)
  *H10K 59/80*  (2023.01)
  *G09G 3/3208*    (2016.01)
  *H10K 77/10*     (2023.01)
  *H10K 102/00*    (2023.01)

(52) U.S. Cl.
  CPC ... *H10K 59/80515* (2023.02); *H10K 59/8792* (2023.02); *G09G 3/3208* (2013.01); *G09G 2300/046* (2013.01); *G09G 2300/0465* (2013.01); *G09G 2320/0233* (2013.01); *G09G 2320/0295* (2013.01); *H10K 77/111* (2023.02); *H10K 2102/311* (2023.02)

(56) References Cited

U.S. PATENT DOCUMENTS

| | | | | |
|---|---|---|---|---|
| 2022/0406857 | A1* | 12/2022 | Du | G02F 1/133514 |
| 2024/0168353 | A1* | 5/2024 | Zhang | G06V 40/16 |

FOREIGN PATENT DOCUMENTS

| | | | |
|---|---|---|---|
| CN | 108987451 | A | 12/2018 |
| CN | 208189154 | U | 12/2018 |
| CN | 111863920 | A | 10/2020 |
| CN | 112786671 | A | 5/2021 |
| CN | 114114753 | A | 3/2022 |
| CN | 114609822 | A | 6/2022 |
| CN | 115187020 | A | 10/2022 |
| KR | 101861309 | B1 | 7/2018 |

\* cited by examiner

DRIVING METHOD OF DISPLAY PANEL, DISPLAY PANEL, AND DISPLAY DEVICE

CROSS-REFERENCE TO RELATED APPLICATIONS

This application claims the priority and benefit of Chinese patent application number 202310785740.X, entitled "Driving Method of Display Panel, Display Panel, and Display Device" and filed Jun. 29, 2023 with China National Intellectual Property Administration, the entire contents of which are incorporated herein by reference.

TECHNICAL FIELD

This application relates to the field of display technology, and more particularly relates to a driving method of a display panel, a display panel, and a display device.

BACKGROUND

The description provided in this section is intended for the mere purpose of providing background information related to the present application but doesn't necessarily constitute prior art.

As people have higher and higher requirements for display quality, LCD products cannot meet the needs of lightness, thinness, fast response, and low power consumption. OLED display technology has gradually become a mainstream display technology due to its advantages such as fast response speed, wide operating temperature range, high contrast, large viewing angle, ultra-thin panel, and the ability to realize flexible display and transparent display.

The OLED (Organic Light-emitting Diode) device is a self-luminous structure, and its principle is as follows. An ITO transparent electrode and a metal electrode are used as the anode and cathode of the device respectively. Driven by a certain voltage, electrons and holes move from the cathode and anode respectively to the organic light-emitting layer to recombine and emit visible light to pass through the filter layer for display. In OLEDs, the anode opening may remain unchanged before and after stretching, that is, the width of the color filter in the filter layer remains unchanged. Since the organic light-emitting layer above the anode may be much larger than the opening defined by the anode, the screen resolution and display brightness may be reduced after stretching.

SUMMARY

In view of the above, it is a purpose of this application to provide a driving method of a display panel, a display panel, and a display device, so as to address the problem of deteriorating resolution caused by a relatively small aperture ratio of the display panel after stretching.

This application discloses a driving method of a display panel. The display panel includes an organic light-emitting layer and a light filter. The light filter is arranged on a light exit surface of the organic light-emitting layer. Corresponding to each pixel area, the light filter includes a color filter and a first electrochromic layer and a second electrochromic layer respectively disposed on both sides of the color filter. The driving method includes:

detecting a current state of the display panel, when in the stretched state, controlling the first electrochromic layer and the second electrochromic layer to become filter layers having the same color as the corresponding color filter; when in the unstretched state, controlling the first electrochromic layer and the second electrochromic layer to become opaque;

where the color-changing material in the first electrochromic layer is the same as the color-changing material in the second electrochromic layer, and may be changed into the same color as the color filter, or into black or transparent color under the action of an electric field.

In some embodiments, a third electrochromic layer is disposed on the side of the color filter facing away from the organic light-emitting layer, and the driving method further includes:

detecting the current display mode, if a black state is displayed, controlling the first electrochromic layer, the second electrochromic layer, and the third electrochromic layer to become opaque; if a bright state is displayed, controlling the first electrochromic layer and the second electrochromic layer to become opaque, and controlling the third electrochromic layer to be transparent:

where the third electrochromic layer may be changed into black or transparent color.

In some embodiments, a third electrochromic layer is disposed on the side of the color filter facing away from the organic light-emitting layer. The step of detecting the current state of the display panel, when in the stretched state, controlling the first electrochromic layer and the second electrochromic layer to become filter layers having the same color as the corresponding color filter; when in the unstretched state, controlling the first electrochromic layer and the second electrochromic layer to become opaque includes:

detecting the current display mode; if a black state is displayed, there is no need to detect the current state of the display panel, directly controlling the first electrochromic layer, the second electrochromic layer, and the third electrochromic layer to become opaque; if a bright state is displayed, detecting the current state of the display panel, and if the display panel is currently in a stretched state, controlling the first electrochromic layer and the second electrochromic layer to become filter layers having the same color as the corresponding color filter; if the display panel is currently in an unstretched state, controlling the first electrochromic layer and the second electrochromic layer to become opaque, and controlling the third electrochromic layer to be transparent.

In some embodiments, the first electrochromic layer includes a first color-changing portion and a first light-shielding portion. The second electrochromic layer includes a second color-changing portion and a second light-shielding layer. The step of detecting the current state of the display panel, when in the stretched state, controlling the first electrochromic layer and the second electrochromic layer to become filter layers having the same color as the corresponding color filter; when in the unstretched state, controlling the light transmittance of the first electrochromic layer and the second electrochromic layer to become opaque includes:

detecting the current state of the display panel, when in the stretched state, controlling the first color-changing portion and the second color-changing portion to become filter layer having the same color as the corresponding color filter, controlling the first light-shielding portion and the second light-shielding layer to become opaque; when in an unstretched state, controlling the first color-changing portion, the first light-shielding portion, the second color-changing portion, and the second light-shielding layer to become opaque.

In some embodiments, the filter includes a first color filter, a second color filter, and a third color filter with different colors. The first electrochromic layer and the second electrochromic layer are arranged between two adjacent color filters. The driving method further includes:

detecting the display mode of any three adjacent pixels, if the middle pixel displays a bright state and the pixels on both sides display a black state, controlling the first electrochromic layer corresponding to the middle pixel and the second electrochromic layer of the adjacent pixel to become filter layers having the same color as the color filter corresponding to the middle pixel, and simultaneously controlling the second electrochromic layer corresponding to the middle pixel and the first electrochromic layer of the adjacent pixel to become filter layer having the same color as the color filter corresponding to the middle pixel.

In some embodiments, a third electrochromic layer is disposed on the side of the color filter facing away from the organic light-emitting layer. The step of detecting the display mode of any three adjacent pixels, if the middle pixel displays a bright state and the pixels on both sides display a black state, controlling the first electrochromic layer corresponding to the middle pixel and the second electrochromic layer of the adjacent pixel to become filter layers having the same color as the color filter corresponding to the middle pixel, and simultaneously controlling the second electrochromic layer corresponding to the middle pixel and the first electrochromic layer of the adjacent pixel to become filter layer having the same color as the color filter corresponding to the middle pixel includes:

detecting the current state of the display panel, if it is in a stretched state, detecting the current display mode, if any three adjacent pixels are displayed in black state, controlling all the first electrochromic layer, the second electrochromic layer, and the third electrochromic layer to become opaque; if any three adjacent pixels are displayed in a bright state, controlling the first electrochromic layer and the second electrochromic layer corresponding to each pixel to become filter layers having the same color as the corresponding color filter, and controlling the third electrochromic layer to be a transparent color.

This application further discloses a display panel. The display panel includes an organic light-emitting layer and a light filter disposed on a light-exit surface of the organic light-emitting layer. Corresponding to each pixel area, the light filter includes a color filter and a first electrochromic layer and a second electrochromic layer respectively disposed on both sides of the color filter;

a first electric-field driving module is disposed corresponding to each first electrochromic layer, and a second electric-field driving module is disposed corresponding to each second electrochromic layer; the display panel further includes a detection module, which is connected to each of the first electric-field driving module and the second electric-field driving module; the first electric-field driving module receives a first signal from the detection module to control the first electrochromic layer to realize color change; the second electric-field driving module receives a second signal from the detection module to control the second electrochromic layer to realize color change;

the color-changing material in the first electrochromic layer is the same as the color-changing material in the second electrochromic layer, and both may be changed into the same color as the color filter, or into black or transparent color under the action of an electric field;

the display panel is driven using the following driving method, including:

detecting the current state of the display panel, when in the stretched state, controlling the first electrochromic layer and the second electrochromic layer to become filter layers having the same color as the corresponding color filter;

controlling the first electrochromic layer and the second electrochromic layer to become opaque when in an unstretched state.

In some embodiments, a third electrochromic layer is disposed on the side of the color filter facing away from the organic light-emitting layer. A third electric-field driving module is disposed corresponding to the third electrochromic layer. The detection module is connected to the third electric-field driving module. The third electric-field driving module receives a third signal from the detection module to control the third electrochromic layer to realize a color change;

the first electric-field driving module, the second electric-field driving module, and the third electric-field driving module each include two oppositely arranged transparent electrodes; the electrochromic layer corresponding to each of the first electric-field driving module, the second electric-field driving module, and the third electric-field driving module is sandwiched in the corresponding two electrodes; the distance between the two transparent electrodes corresponding to the first electric-field driving module is equal to the distance between the two transparent electrodes corresponding to the second electric-field driving module, and is greater than or equal to the sum of the distance between the two transparent electrodes of the third electric-field driving module and the thickness of the color filter;

the third electrochromic layer may be changed into black or transparent color, and the first electrochromic layer and the second electrochromic layer may each be doped with a metal material whose ductility is greater than a preset threshold.

In some embodiments, the first electrochromic layer includes a first color-changing portion and a first light-shielding portion. The second electrochromic layer includes a second color-changing portion and a second light-shielding portion. An electrochromic material or a black opaque material is disposed in each of the first light-shielding portion and the second light-shielding portion.

This application further discloses a display device. The display device includes a display panel and a driving circuit, which is used to drive the display panel. The display panel includes an organic light-emitting layer and a light filter disposed on a light-exit surface of the organic light-emitting layer. Corresponding to each pixel area, the light filter includes a color filter and a first electrochromic layer and a second electrochromic layer respectively disposed on both sides of the color filter;

a first electric-field driving module is disposed corresponding to each first electrochromic layer, and a second electric-field driving module is disposed corresponding to each second electrochromic layer; the display panel further includes a detection module, which is connected to each of the first electric-field driving module and the second electric-field driving module; the first electric-field driving module receives a first signal from the detection module to control the first electrochromic layer to realize color change; the second electric-field driving module receives a second signal from the detection module to control the second electrochromic layer to realize color change;

where the color-changing material in the first electrochromic layer is the same as the color-changing material in the second electrochromic layer, and may be changed into the same color as the color filter, or into black or transparent color under the action of an electric field.

Compared with the stretchable screen solution where the aperture ratio remains unchanged after stretching thus resulting in a decrease in resolution, this application provides a first electrochromic layer and a second electrochromic layer respectively on both sides of the color filter. Before stretching, the first electrochromic layer and the second electrochromic layer are opaque and used as a black matrix. After stretching, the width of the organic light-emitting layer increases, but the width of the color filter does not change at this time. By controlling the first electrochromic layer and the second electrochromic layer to become filter layers having the same color as the corresponding color filter, that is, using the first electrochromic layer and the second electrochromic layer as color filters, the aperture ratio of the OLED is increased and the resolution of the stretched display panel is improved.

BRIEF DESCRIPTION OF DRAWINGS

The accompanying drawings are used to provide a further understanding of the embodiments according to this application, and constitute a part of the specification. They are used to illustrate the embodiments according to this application, and explain the principle of this application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
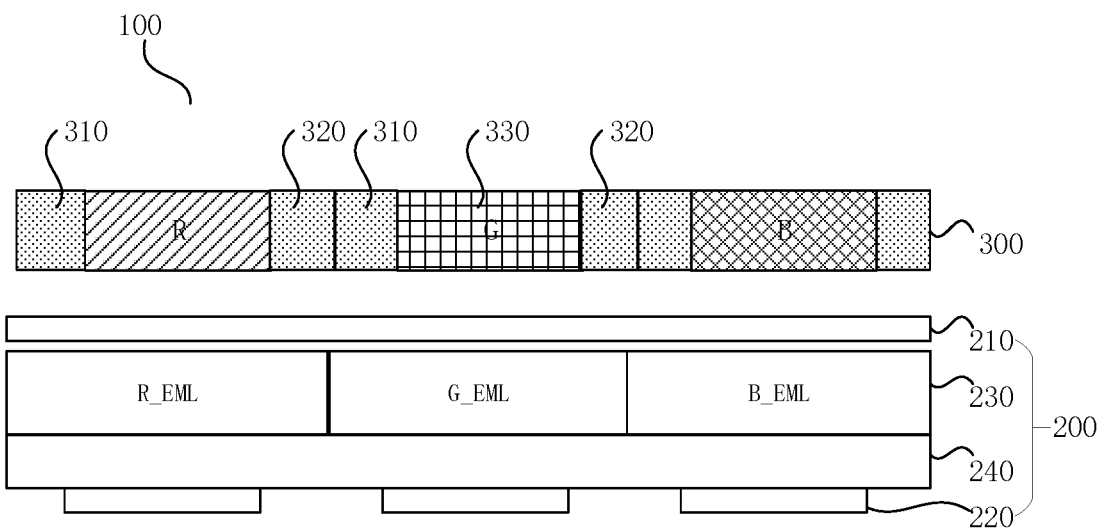
FIG. 1 is a schematic diagram of a display panel (before stretching) according to a first embodiment of the present application.

In the drawings: 100. Display panel; 200. Organic light-emitting layer; 210. Cathode; 220. Anode; 230. Organic material light-emitting area; 240. Pixel defining layer; 300. Light filter; 310. First electrochromic layer; 311. First color-changing portion; 312. First light-shielding portion; 320. Second electrochromic layer; 321. Second color-changing portion; 322. Second light-shielding portion; 330. Third electrochromic layer; 340. Color filter; 400. Detection module; 500. Electric-field driving module; 510. First electric-field driving module; 520. Second electric-field driving module; 530. Third electric-field driving module; 600. Driving circuit; 700. Display device; R—red color filter; G—green color filter; B—blue color filter; R_EML—red organic luminescent material; G_EML—green organic luminescent material; B_EML—blue organic luminescent material; PDL—pixel defining area.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

Hereinafter this application will be described in further detail with reference to the accompanying drawings and some optional embodiments.

Embodiment 1

Figure 2:
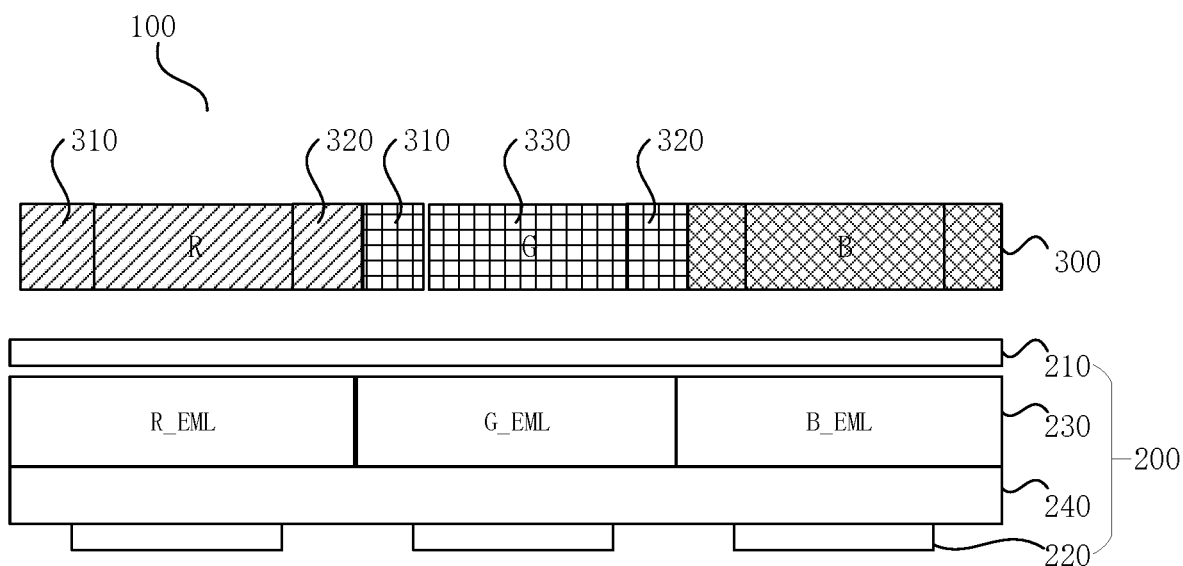
FIG. 2 is a schematic diagram of a display panel (after stretching) according to the first embodiment of the present application.

Referring to FIGS. 1 to 2, the display panel 100 is an OLED panel using COE technology. The display panel 100 includes an organic light-emitting layer 200 and a filter layer. The light filter 300 is disposed on a light exit surface of the organic light-emitting layer 200. The light filter 300 includes a color filter 340, and a first electrochromic layer 310 and a second electrochromic layer 320 that are respectively disposed on both sides of the color filter 340. The driving method includes the following steps:

S1: detecting a current state of the display panel, when in a stretched state, controlling the first electrochromic layer and the second electrochromic layer to become filter layers having the same color as the corresponding color filter; when in the unstretched state, controlling the first electrochromic layer and the second electrochromic layer to become opaque;

The color-changing material in the first electrochromic layer 310 and the color-changing material in the second electrochromic layer 320 are the same. They are both electrochromic materials B, which can be changed into the same color as the color filter 340, or into black or transparent color under the action of an electric field. The color filter 340 includes a red color filter 340R, a green color filter 340G, and a blue color filter 340B, which can be arranged as needed. The organic light-emitting layer 200 includes a cathode 210, an anode 220, and an organic material light-emitting area 230 disposed between the cathode 210 and the anode 220. The organic material light-emitting area 230 is arranged corresponding to the respective color filter 340. In particular, the organic material light-emitting area 230 includes a red organic light-emitting material R_EML area corresponding to the red color filter 340R, a red organic light-emitting material G_EML area corresponding to the green color filter 340G, and a blue organic light-emitting material B_EML area corresponding to the blue color filter 340B. In order to realize the color change of the electrochromic layer, a pair of transparent electrodes may be disposed at the upper and lower sides of each electrochromic layer to form an electric field, and by changing the voltages of the upper and lower electrodes, different electric fields are formed, thereby causing the electrochromic layer to realize different color changes.

It should be noted that in stretchable screens, the opening of the anode 220 may remain unchanged before and after stretching, which may reduce the screen resolution and display brightness. When the screen of the above structure is at a stretched state in this proposal, the anode 220 is set as an elastic conductor to have stretchable properties, so that the opening area of the anode 220 can be enlarged accordingly. Since the organic light-emitting layer 200 above the anode 220 may be much larger than the opening defined by the anode 220, it is only needed to increase the filtering effect of the COE structure accordingly to increase the pixel opening in the stretched state. Since the original color filter layer in COE may not have stretchable properties, the electrochromic material B may be used for compensation, that is, the electrochromic material B may be made stretchable by doping some metal materials with good ductility. In particular, when the screen is stretched, the original RGB filter layer in the COE and the electrochromic material A above it are not stretched, it is the electrochromic material B that is stretched. The stretching degree of B may match the stretching condition of the anode 220, so it can adapt to screens with different stretching degrees.

In particular, before changing the color of the first electrochromic layer 310 and the second electrochromic layer 320, the state of the display panel 100 may be detected. Before the display panel 100 is stretched, the first electrochromic layer 310 and the second electrochromic layer 320 disposed on both sides of the color filter 340 respectively are used as a black matrix. After the display panel 100 is stretched, considering that the width of the organic light-emitting material area increases, the corresponding light-emitting area also increases. If the first electrochromic layer 310 and the second electrochromic layer 320 are still used as a black matrix, the light emitted by the organic light-emitting material region can only pass through the color filter 340 for display. At this time, the contrast of the stretched display screen is significantly reduced compared to the unstretched display screen, which brings an undesired viewing experience to the user. Therefore, at this time, the first electrochromic layer 310 and the second electrochromic layer 320 disposed on both sides of the color filter 340 may become filters of the same color as the color filter 340, that is, used as the color filter 340, thereby increasing the aperture ratio and improving the contrast of the stretched display panel 100. Since this proposal has the filtering effect of COE itself, in addition to the true R/G/B OLED products of this proposal, it can also be applied to quantum dot OLED and blue light OLED products.

Embodiment 2

Figure 3:
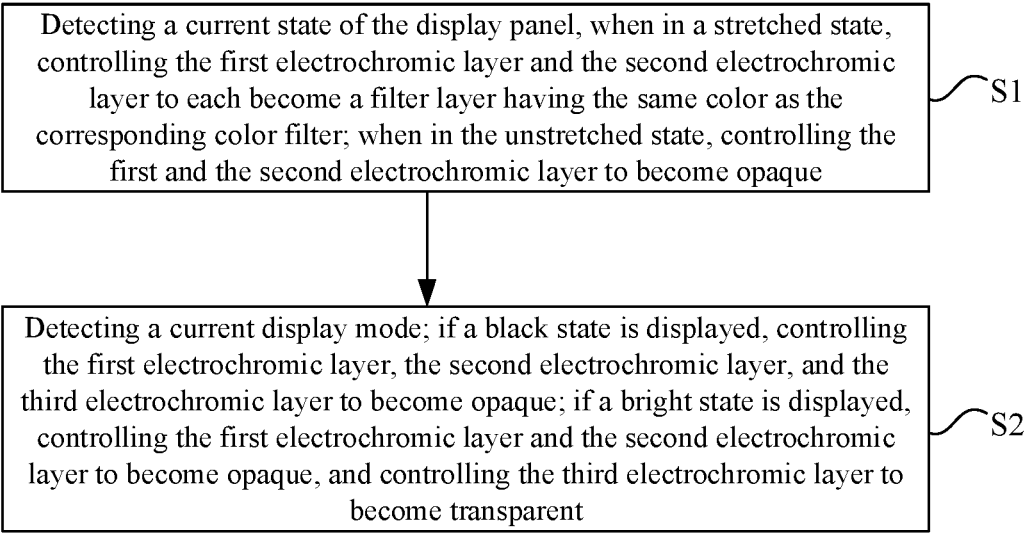
FIG. 3 is a schematic flow chart of a driving method according to a second embodiment of the present application.

Different from Embodiment 1, a third electrochromic layer 330 is further disposed on the side of the color filter 340 facing away from the organic light-emitting layer 200, that is, a further electrochromic layer is added to the color filter 340. This embodiment mainly focuses on the specific changes of the first electrochromic layer 310, the second electrochromic layer 320, and the third electrochromic layer 330 of the display panel 100 in the black mode or the bright mode. Referring to FIG. 3, the driving method further includes the following step.

S2: detecting the current display mode; if the black state is displayed, controlling the first electrochromic layer, the second electrochromic layer, and the third electrochromic layer to become opaque; if the bright state is displayed, controlling the first electrochromic layer and the second electrochromic layer to become opaque, and controlling the third electrochromic layer to be transparent:

The third electrochromic layer 330 may be changed into black or transparent color. The third electrochromic layer 330 may be formed using an electrochromic material A.

Figure 4:
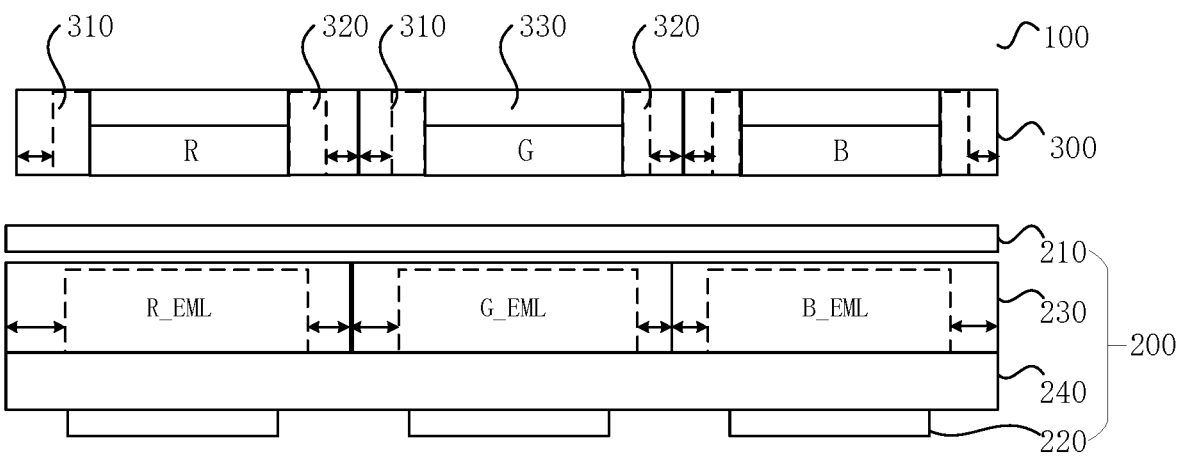
FIG. 4 is a schematic diagram of the display panel before and after stretching according to the second embodiment of the present application.
Figure 5:
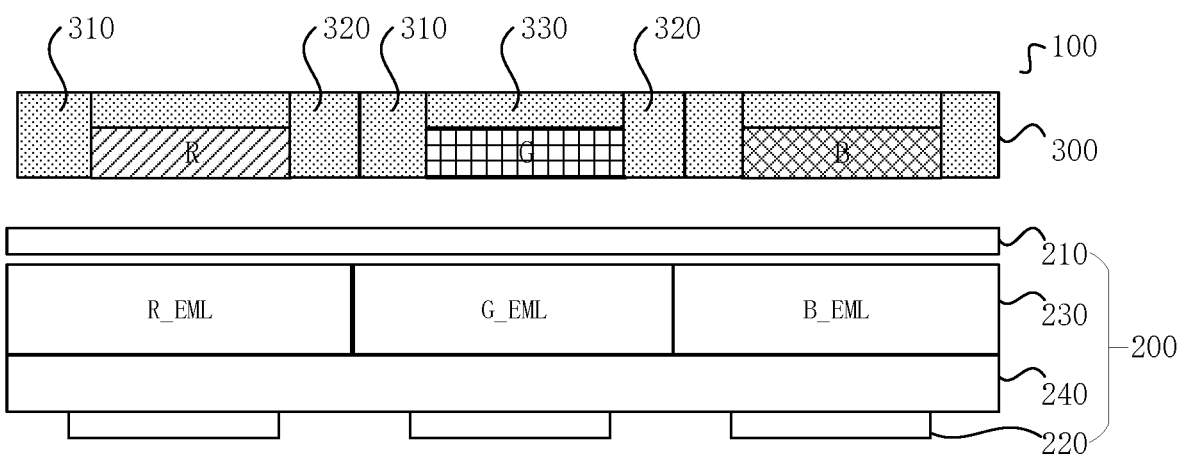
FIG. 5 is a schematic diagram of the display panel (black state display mode) according to the second embodiment of the present application.
Figure 6:
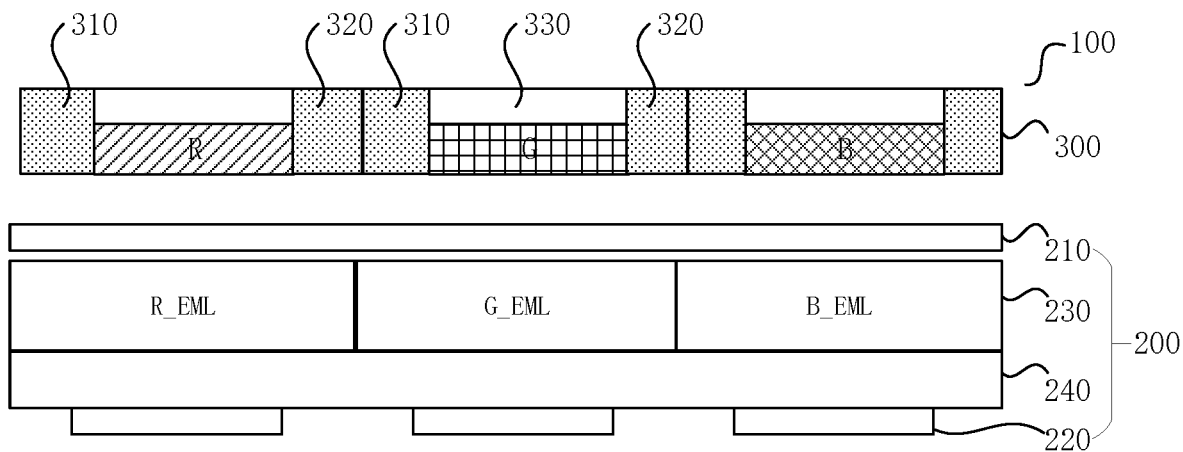
FIG. 6 is a schematic diagram of the display panel (bright state display mode) according to the second embodiment of the present application.

Referring to FIGS. 4 to 6, considering that the organic light-emitting layer 200 does not emit light when the display panel 100 displays a black state before or after stretching, the ambient light may pass through the color filter 340 to reach the organic light-emitting layer 200, causing color separation. In order to avoid this phenomenon, a third electrochromic layer 330 is disposed on the color filter 340. In the black state, the first electrochromic layer 310, the second electrochromic layer 320, and the third electrochromic layer 330 are controlled to become opaque. If it is needed to display a bright state, the first electrochromic layer 310 and the second electrochromic layer 320 may be controlled to become opaque, and the third electrochromic layer 330 may be controlled to be transparent.

In particular, as shown in FIG. 5, in the unstretched state, when the screen is turned off and presents a black state, the first electrochromic layer 310, the second electrochromic layer 320, and the third electrochromic layer 330 above and around each of all sub-pixel color filters 340 in the entire screen display area are all in a black opaque state. At this time, after natural light shines on the screen, most of the natural light may be absorbed after passing through the black opaque electrochromic film layer. Therefore, no natural light may enter the interior of the OLED at this time, and there may be no reverse emission out of the screen, so there may no longer be an obvious halo phenomenon in the black state, thus effectively overcoming the shortcoming of black state reflection of the OLED COE structure.

As shown in FIG. 6, in the unstretched state, when the screen needs to display a bright state, the third electrochromic layer 330 above each of all sub-pixel color filters 340 in the entire screen display area is in a transparent light-transmitting state, and the first electrochromic layer 310 and the second electrochromic layer 320 around the color filter 340 are in a black state and are opaque to light. At this time, natural light passes through the transparent third electrochromic layer 330 and then reaches the lower color filter 340. The natural light becomes monochromatic light after being filtered by the color filter 340, and the monochromatic light and the light emitted by the organic light-emitting layer 200 may be totally reflected by the anode 220. At this time, the light may all pass through the organic light-emitting layer 200, the color filter 340, and the electrochromic layer to be emitted thus achieving a normal display effect. The photochromic materials between the color-displaying openings of the anode 220 are all in a black opaque state, which is equivalent to the original black matrix absorbing edge light.

Embodiment 3

As the third embodiment of this application, unlike the second embodiment mentioned above, if simply considering the display mode without considering the state of the display panel 100, then continuing to use the first electrochromic layer 310 and the second electrochromic layer 310 as a black matrix may affect the contrast of the stretched display panel 100. In order to solve the problem of contrast after stretching, this embodiment further refines step S1 in the above embodiment, where the step S1 includes the following operations.

S11: detecting the current display mode; if the black state is displayed, there is no need to detect the current state of the display panel 100, and directly controlling the first electrochromic layer 310, the second electrochromic layer 320, and the third electrochromic layer 330 to become opaque; if the bright state is displayed, detecting the current state of the display panel 100, and if the display panel 100 is currently in a stretched state, controlling the first electrochromic layer 310 and the second electrochromic layer 320 to become filter layers having the same color as the corresponding color filter 340, and if the display panel 100 is currently in an unstretched state, then controlling the first electrochromic layer 310 and the second electrochromic layer 320 to become opaque, and controlling the third electrochromic layer 330 to be transparent.

Referring to FIG. 5, in the stretched state, when the screen is turned off and presents a black state, both the third electrochromic layer 330 and B above and around each of all the sub-pixel color filters 340 in the entire screen display area are in a black opaque state. At this time, after natural light shines on the screen, most of the natural light may be absorbed after passing through the black opaque electrochromic film layer. At this time, no natural light may enter the interior of the OLED, and there may be no reverse emission out of the screen, so there may no longer be an obvious halo phenomenon in the black state, thus effectively overcoming the shortcoming of black state reflection of the OLED COE structure.

Figure 7:
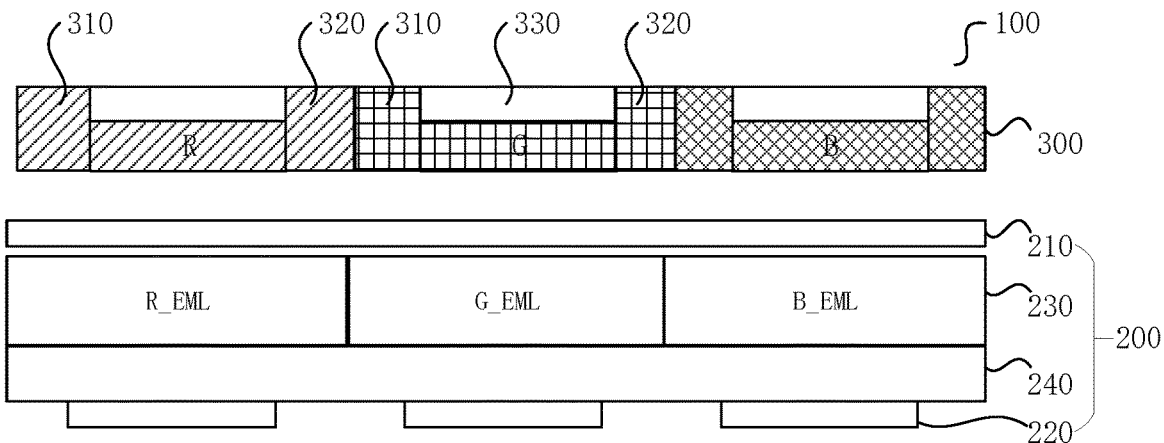
FIG. 7 is a schematic diagram of a display panel (after stretching) according to a third embodiment of the present application.

Referring to FIG. 7, in the stretched state, when the screen needs to display a bright state, the third electrochromic layer 330 above each of all sub-pixel color filters 340 in the entire screen display area is in a transparent light-transmitting state, and the first electrochromic layer 310 and the second electrochromic layer 320 around the color filter 340 are in a color filter state after the anode 220 is stretched. At this time, the natural light may become monochromatic light through the transparent third electrochromic layer 330 and the lower color filter 340, and the natural light may also become monochromatic light after passing through the first electrochromic layer 310 and the second electrochromic layer 320 that filter light. These monochromatic lights and the light emitted by the organic light-emitting layer 200 may be totally reflected by the anode 220. At this time, the light may all pass through the organic layer, the color filter 340, the first electrochromic layer 310, the second electrochromic layer 320, and the third electrochromic layer 330 to be emitted, thereby achieving a normal display effect.

Embodiment 4

Figure 8:
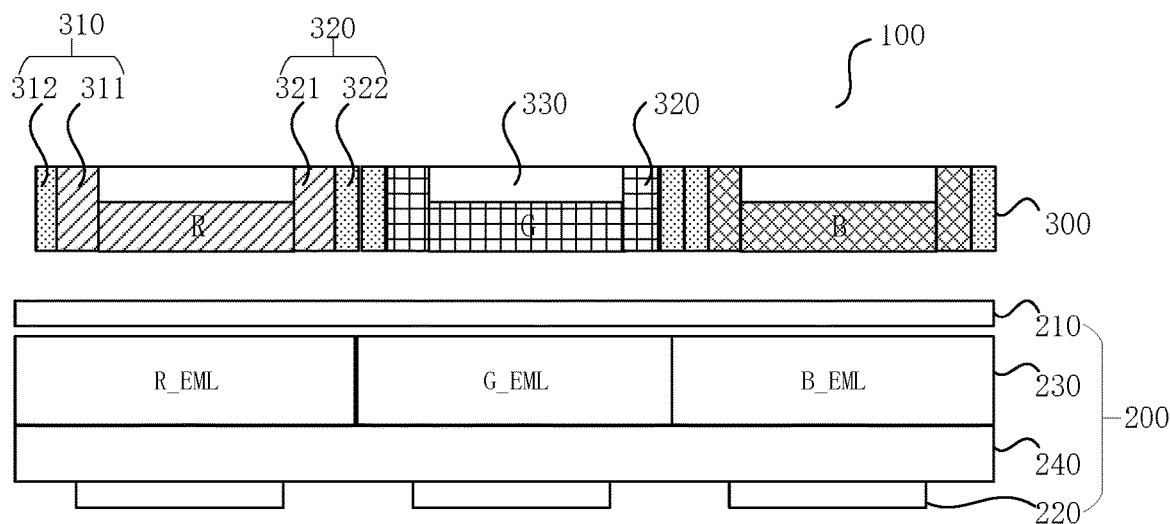
FIG. 8 is a schematic diagram of a display panel according to a fourth embodiment of the present application.

Referring to FIG. 8, as a fourth embodiment of this application, different from the above embodiment, the first electrochromic layer 310 includes a first color-changing portion 311 and a first light-shielding portion 312, and the second electrochromic layer 320 includes a second color-changing portion 321 and a second light-shielding layer. The operations of detecting the current state of the display panel 100, controlling the first electrochromic layer 310 and the second electrochromic layer 320 to become filter layers having the same color as the corresponding color filter 340 when in the stretched state, and controlling the first electrochromic layer 310 and the second electrochromic layer 320 to become opaque when in the unstretched state include the following.

detecting the current state of the display panel 100, when in the stretched state, controlling the first color-changing portion 311 and the second color-changing portion 321 to become a filter layer having the same color as the corresponding color filter 340, and controlling the first light-shielding portion 312 and the second light-shielding layer to become opaque; when in an unstretched state, controlling the first color-changing portion 311, the first light-shielding portion 312, the second color-changing portion 321, and the second light-shielding layer to become opaque.

One part corresponding to the anode 220 has tensile elasticity, and its deformation in the stretched state can adapt to the stretched size of the anode 220. The other part has no tensile elasticity and is always black and opaque. This part of material does not require electrodes, and functions as a black matrix between the pixel openings to absorb light and prevent color mixing. When the anode 220 is in a stretched state, the first luminescent area or the second luminescent area with stretchable properties adjacent to the color filter 340 may stretch according to the stretching degree of the anode 220, and the electrode above the corresponding position may also stretch accordingly. When the screen is not displayed, the first color-changing portion 311, the second color-changing portion 321, and the third electrochromic layer 330 above and around the R/G/B color filter 340 are all in a black opaque state. When R/G/B is fully displayed, the electrochromic material A above the R/G/B color filter 340 is in a transparent state, and the surrounding B that is in a stretched state is in a color filter state, and the unstretched B is in a black and opaque state. This solution can be contemplated especially when the color mixing phenomenon is serious.

Embodiment 5

Figure 9:
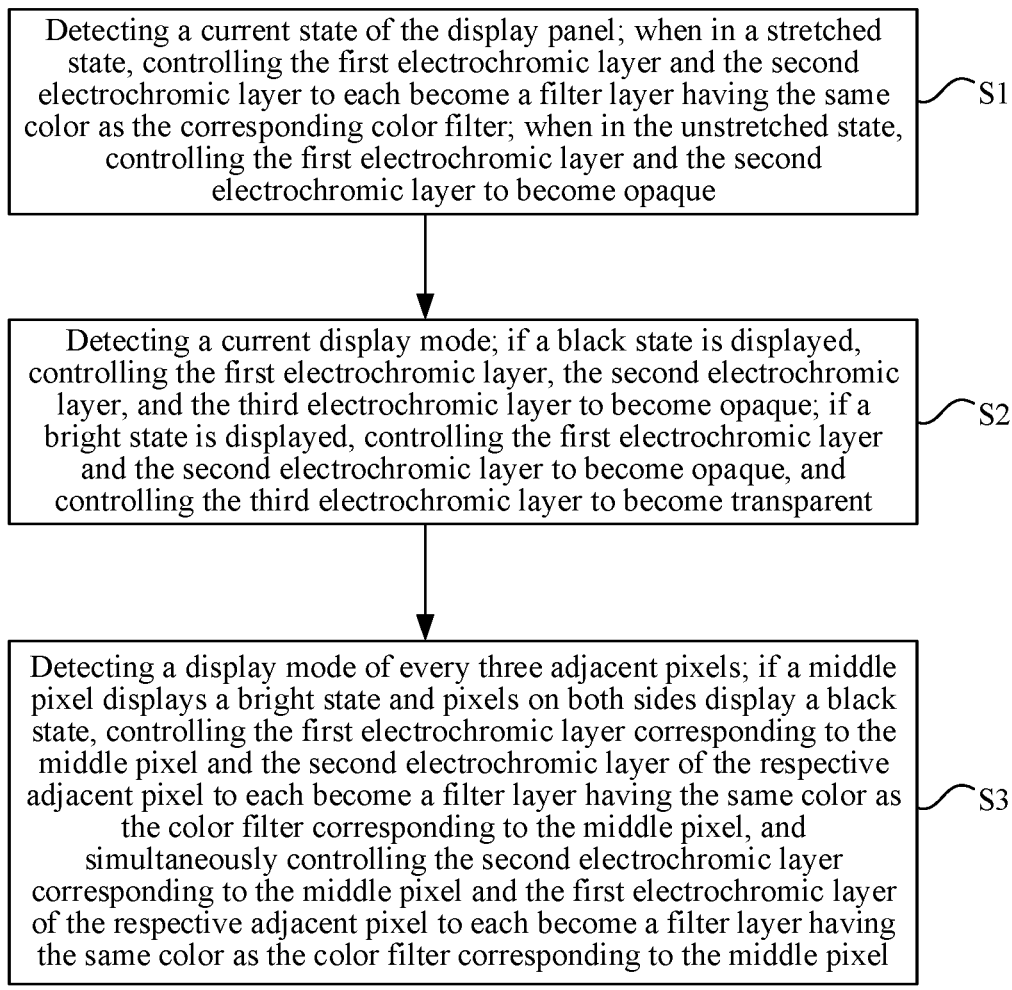
FIG. 9 is a schematic flowchart of a driving method of a display panel according to a fifth embodiment of the present application.

As a fifth embodiment of this application, unlike the above-mentioned embodiments, this embodiment involves adjustments for some special situations. For example, when among the three RGB pixels, only the middle pixel is bright, and the pixels on both sides are not bright, then the color of the first electrochromic layer 310, the second electrochromic layer 320, and the third electrochromic layer 330 may be changed. The light filter 300 includes a first color filter 340, a second color filter 340, and a third color filter 340 with different colors. The first electrochromic layer 310 and the second electrochromic layer 320 are disposed between two adjacent color filters 340. Correspondingly, as shown in FIG. 9, the driving method further includes the following step.

S3: detecting a display mode of any three adjacent pixels; if the middle pixel displays a bright state and the pixels on both sides display a black state, controlling the first electrochromic layer corresponding to the middle pixel and the second electrochromic layer of the adjacent pixel to become filter layers having the same color as the color filter corresponding to the middle pixel, and simultaneously controlling the second electrochromic layer corresponding to the middle pixel and the first electrochromic layer of the adjacent pixel to become filter layers having the same color as the color filter corresponding to the middle pixel.

Figure 10:
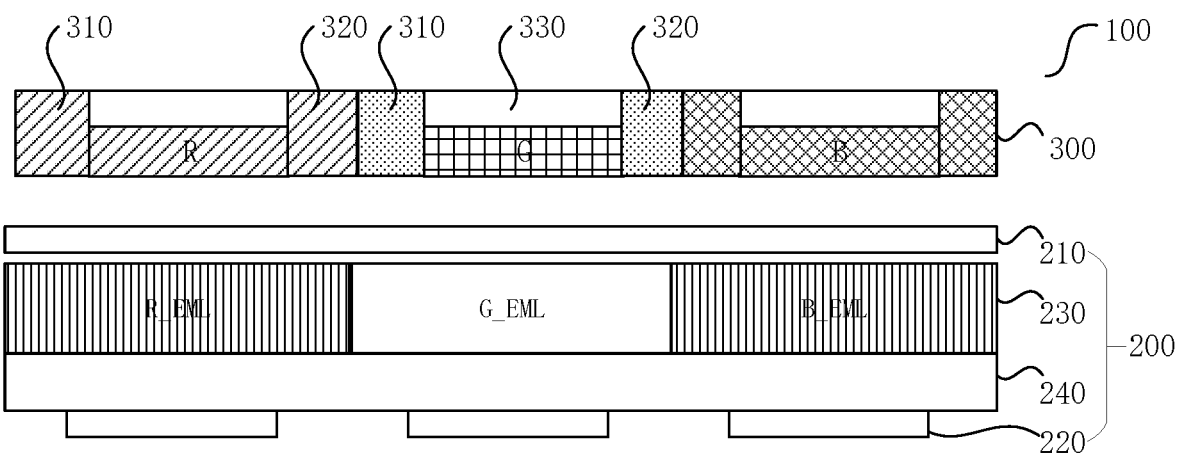
FIG. 10 is a schematic diagram of the display panel (light-emitting area) according to the fifth embodiment of the present application.
Figure 11:
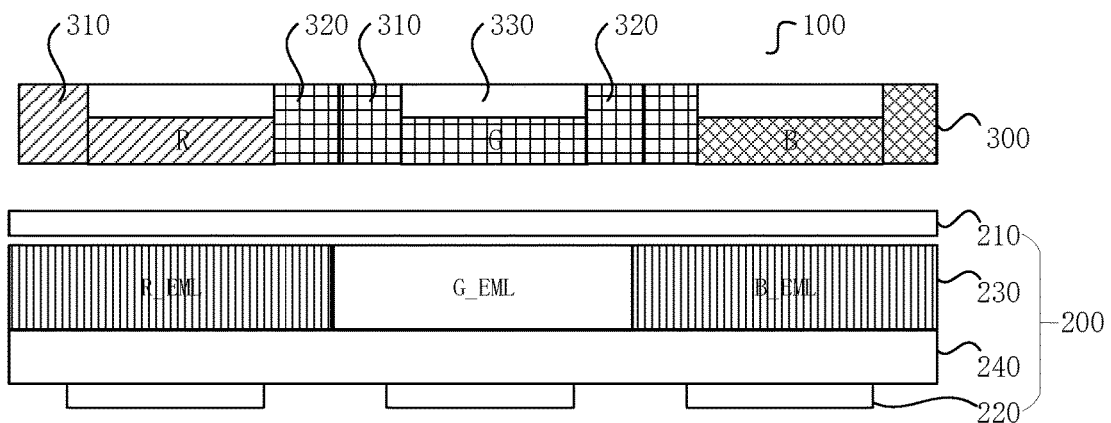
FIG. 11 is a schematic diagram of another display panel (single pixel black state) according to the fifth embodiment of the present application.

Referring to FIG. 10 to FIG. 11, in the unstretched state, when the screen is displayed normally, in terms of a single complete pixel including R/G/B sub-pixels, there may be a phenomenon where one sub-pixel emits light and the others do not emit light. This proposal is illustrated with G being bright and R/B being not lit up for explanation. Due to the crosstalk caused by the common layer introduced in the background art, there may be a situation where the organic light-emitting layer 200 steals light for the R/B pixel in this case. Therefore, when G needs to be displayed and R/B does not need to be displayed, the electrodes corresponding to the electrochromic layers on R/G/B may be controlled individually so that the third electrochromic layer 330 above G is in a transparent and light-transmitting state, and the surrounding first and second electrochromic layers 310 and 320 are in a black and opaque state or become filter layers having the same color as G, and the electrochromic material A above R/B may be in a black opaque state, while the electrochromic material B on the side of R/B adjacent to G may be in a black opaque state or in a filter layer state having the same color as G. As shown in FIG. 10, G is displayed normally in this case. Since the electrochromic films above and around R/B are in a black opaque state, they can simultaneously absorb the ambient light outside the screen above and the bright stolen light emitted by the organic light-emitting layer 200 below, so it can present a completely black state. Contrasting thereto, in the original COE structure product, some ambient light and bright light may also emit from the G/B pixels at this time, which may cause a slight color mixing at the edge of the B's display opening, and R/B are also not black enough. Therefore, in summary, the OLED product with proposed new COE composite structure can effectively improve the display contrast when not stretched.

In the stretched state, when the screen is displayed normally, in terms of a single complete pixel including R/G/B sub-pixels, there may be a phenomenon where one sub-pixel emits light while the others do not. This proposal is illustrated with G being displayed and R/B being not lit up for explanation. Due to the crosstalk caused by the common layer introduced in the background art, there may be a situation where the organic light-emitting layer 200 steals light for the R/B pixel in this case. Therefore, when G needs to be displayed and R/B does not need to be displayed, the electrodes of the electrochromic film on each of R/G/B may be controlled individually, so that the third electrochromic layer 330 above G is in a transparent and light-transmitting state, the surrounding electrochromic material B is in a green filter state, and the electrochromic materials A and B above and around R/B are in a black and opaque state. At this time, regardless of the location of the electrochromic material B choosing any of the above options, the display effect is consistent. That is, G is displayed normally at this time. Meanwhile, since the electrochromic films above and around R/B is are a black opaque state, they can simultaneously absorb the ambient light outside the above screen and the bright light emitted by the organic light-emitting layer 200 below, so it can present a completely black state. Contrasting thereto, in the original COE structure product, some ambient light and bright light may also emit from the G/B pixels at this time, which may cause a slight color mixing at the edge of the B's display opening, and R/B are also not black enough. Therefore, in summary, the OLED product with proposed new COE composite structure can effectively improve the display contrast when not stretched.

The above three states can switch between each other. The electrodes above and below the electrochromic film on each of the three sub-pixels require a backplate circuit to provide signal control. They are individually connected to each other and cannot be electrically connected or shared. Since electrochromic materials have problems such as attenuation, aging, and response speed, the stability and safety of the composite structure are higher than that of a single structure that eliminates the Color filter 340 and directly uses the colored electrochromic material itself.

Further, a third electrochromic layer 330 is disposed on the side of the color filter 340 facing away from the organic light-emitting layer 200. The operations of detecting the display mode of any three adjacent pixels, if the middle pixel displays a bright state and the pixels on both sides display a black state, controlling the first electrochromic layer 310 corresponding to the middle pixel and the second electrochromic layer 320 of the adjacent pixel to become filter layers having the same color as the color filter 340 corresponding to the middle pixel, and simultaneously controlling the second electrochromic layer 320 corresponding to the middle pixel and the first electrochromic layer 310 of the adjacent pixel to become filter layers having the same color as the color filter 340 corresponding to the middle pixel include:

detecting the current state of the display panel 100, if it is in a stretched state, then detecting the current display mode, and if any three adjacent pixels are displayed in black state, controlling all the first electrochromic layer 310, the second electrochromic layer 310, and the third electrochromic layer 330 to become opaque; if any three adjacent pixels are in a bright state, controlling the first electrochromic layer 310 and the second electrochromic layer 320 corresponding to each pixel to become filter layers having the same color as the corresponding color filter 340, and controlling all the third electrochromic layers 330 to be transparent.

Embodiment 6

Figure 12:
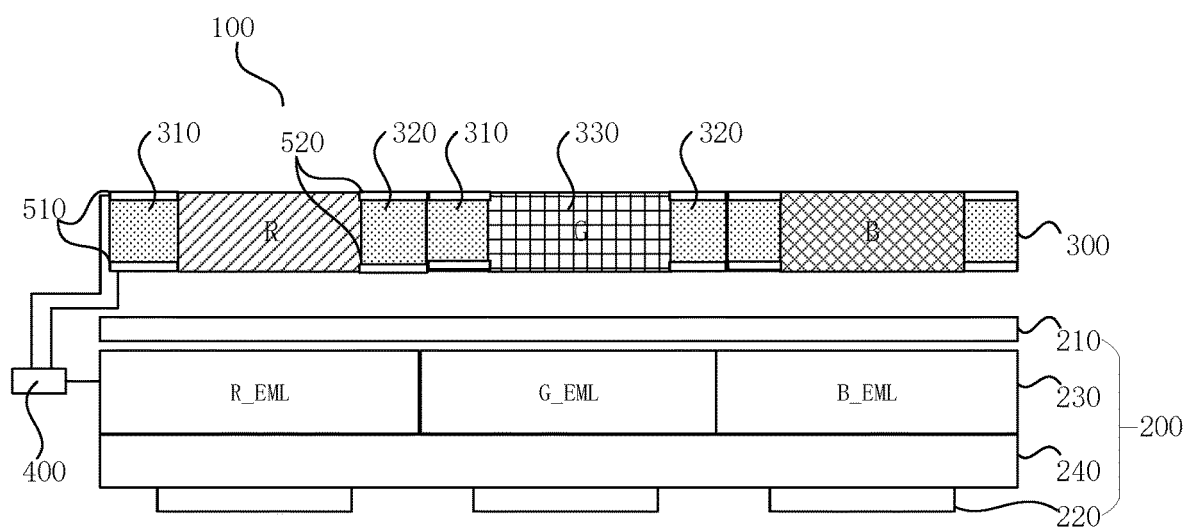
FIG. 12 is a schematic diagram of a display panel according to a sixth embodiment of the present application.

As a sixth embodiment of this application, as shown in FIG. 12, a display panel 100 is disclosed, which is driven using the driving method of any of the above embodiments. The display panel 100 includes an organic light-emitting layer 200 and a light filter 300. The light filter 300 is disposed on the light exit surface of the organic light-emitting layer 200. Corresponding to each pixel area, the light filter 300 includes a color filter 340, and a first electrochromic layer 310 and a second electrochromic layer 320 respectively disposed on both sides of the color filter 340. A first electric-field driving module 510 is disposed corresponding to each first electrochromic layer 310. A second electric-field driving module 520 is disposed corresponding to each second electrochromic layer 320. The display panel 100 further includes a detection module 400, which is connected to both the first electric-field driving module 510 and the second electric-field driving module

520. The first electric-field driving module 510 receives a first signal from the detection module 400 to control the first electrochromic layer 310 to realize a color change. The second electric-field driving module 520 receives a second signal from the detection module 400 to control the second electrochromic layer 320 to realize a color change. The color-changing material in the first electrochromic layer 310 is the same as the color-changing material in the second electrochromic layer 320. Under the action of an electric field, the color-changing material may change into the same color as the color filter 340, or may become a black color or transparent.

This embodiment mainly proposes a new COE composite structure in the display panel 100. By adding electrochromic layers above and around the color filter 340, the display panel 100 may adapt to the increase in aperture ratio after stretching, thus overcoming the color halo phenomenon of the screen in black state that exists in the COE structure itself, and effectively improving the contrast.

Embodiment 7

Figure 13:
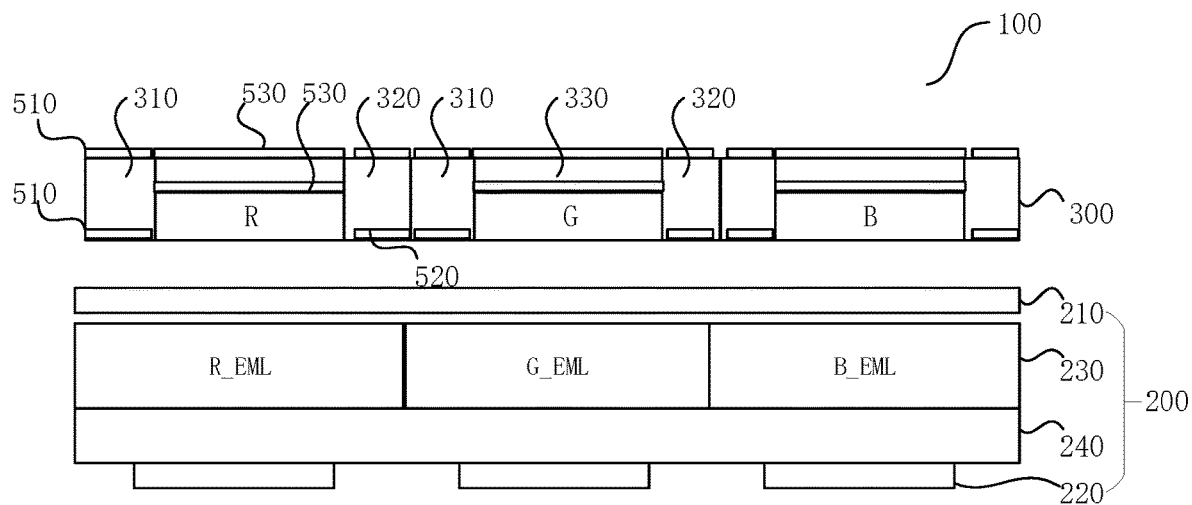
FIG. 13 is a schematic diagram of a display panel according to a seventh embodiment of the present application.

As a seventh embodiment of this application, it is a further limitation of the above-mentioned sixth embodiment. As shown in FIG. 13, a third electrochromic layer 330 is disposed on the side of the color filter 340 facing away from the organic light-emitting layer 200. A third electric-field driving module 530 is disposed corresponding to the third resistive color change layer. The detection module 400 is connected to the third electric-field driving module 530. The third electric-field driving module 530 receives a third signal from the detection module 400 to control the third electrochromic layer 330 to realize a color change. The detection module 400 may be connected to the transparent electrode through corresponding wiring, and may alternatively be connected to another driving circuit 600. The other driving circuit 600 controls the voltages of the electrodes above and below the electrochromic layer to be different, thereby generating the required electric field. The first electric-field driving module 510, the second electric-field driving module 520, and the third electric-field driving module 530 each include two oppositely arranged transparent electrodes. The corresponding electrochromic layer of each of the first electric-field driving module 510, the second electric-field driving module 520, and the third electric-field driving module 530 is sandwiched in the corresponding two electrodes. The distance between the two transparent electrodes corresponding to the first electric-field driving module 510 is equal to the distance between the two transparent electrodes corresponding to the second electric-field driving module 520, and is greater than or equal to the sum of the distance between the two transparent electrodes of the third electric-field driving module 530 and the thickness of the color filter 340.

The third electrochromic layer 330 may be changed into black or transparent color. The first electrochromic layer 310 and the second electrochromic layer 320 are each doped with a metal material whose ductility is greater than a preset threshold. When the screen is turned off and presents a black state, the third electrochromic layer 330 and B above and around the color filter 340 layer of each of all sub-pixels in the entire screen display area are in a black opaque state. At this time, after natural light shines on the screen, most of the natural light may be absorbed after passing through the black opaque electrochromic film layer so that no natural light may enter the interior of the OLED at this time, and there may be no reverse emission out of the screen. Therefore, the obvious halo phenomenon may no longer be seen in the black state, thus effectively overcoming the shortcoming of the black state reflection of the OLED COE structure.

When the screen needs to display a bright state, the third electrochromic layer 330 above the color filter 340 layer of each of all sub-pixels in the entire screen display area is in a transparent and light-transmitting state, while the electrochromic material B around the color filter 340 is in a black state and is opaque. At this time, natural light passes through the transparent photochromic film A and reaches the color filter layer 340 below. The natural light becomes monochromatic light after being filtered by the color filter 340 layer, and this monochromatic light together with the light emitted by the organic light-emitting layer 200 may be totally reflected by the anode 220. At this time, the light may all pass through the organic layer, the color filter layer 340, the photochromic film, and the transparent electrode above and all the light may be emitted to realize a normal display effect. The photochromic material between the color-display openings of the anodes 220 are all in a black and opaque state, which is equivalent to the original black matrix that absorbs edge light.

When the screen displays normally, in terms of a single complete pixel including R/G/B sub-pixels, there may be a phenomenon where one sub-pixel emits light while the others do not. This proposal is illustrated with G being displayed and R/B being not lit. Due to the crosstalk caused by the common layer introduced in the background art, there may be a situation where the organic light-emitting layer 200 steals light for the R/B pixel in this case. Therefore, when G needs to be displayed and R/B does not need to be displayed, the electrodes of the electrochromic films on R/G/B may be controlled individually so that the third electrochromic layer 330 above G is in a transparent light-transmitting state and the surrounding electrochromic material B is in a black and opaque state, and further the electrochromic materials A and B above and around R/B are all in a black and opaque state. At this time, G is displayed normally. Since the electrochromic films above and around R/B are in a black opaque state, they can simultaneously absorb the ambient light outside the screen above and the stolen light emitted by the organic light-emitting layer 200 below, so that it can present a completely black state. In contrast, in the original COE structure product, some ambient light and stolen light may also be emitted from the G/B pixels at this time, which may cause a slight color mixing at the edge of the B's display opening, and the R/B is also not black enough. Therefore, in summary, the OLED product with the proposed new COE composite structure may effectively improve the display contrast when not stretched.

Embodiment 8

Figure 14:
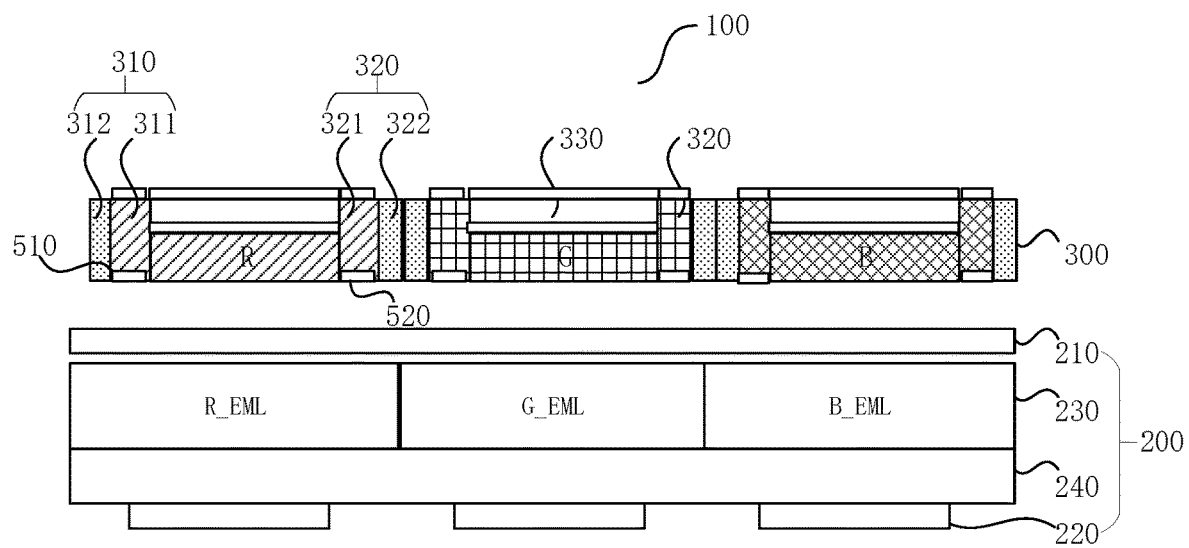
FIG. 14 is a schematic diagram of a display panel according to an eighth embodiment of the present application.

As shown in FIG. 14, as an eighth embodiment of this application, it is an improvement on the display panel 100 in any of the above embodiments. The first electrochromic layer 310 includes a first color-changing portion 311 and a first light-shielding portion 312. The second electrochromic layer 320 includes a second color-changing portion 321 and a second light-shielding portion 322. The first light-shielding portion 312 and the second light-shielding portion 322 each include an electrochromic material or a black opaque material. In this embodiment, transparent electrodes are disposed above and below each of the first color-changing portion 311 and the second color-changing portion 321. The first light-shielding portion 312 and the second light-shielding portion 322 may be formed directly using a black electrochromic layer, and there are no transparent electrodes on the upper and lower sides, and they maintain the black state. Of course, transparent electrodes may also alternatively be disposed above and below each of the first light-shielding portion 312 and the second light-shielding portion 322, where the two light-shielding portions may be turned into transparent areas or filter layers of other colors when necessary.

A part of the first electrochromic layer 310 or the second electrochromic layer 320 has tensile elasticity and is correspondingly disposed on the upper side of the anode 220, and its deformation in the stretched state may adapt to the stretched size of the anode 220. The other part does not have tensile elasticity and is always in a black state and is opaque. This part of the material does not need to be equipped with electrodes, and is equivalent to the black matrix between the pixel openings for absorbing light and preventing color mixing.

Embodiment 9

Figure 15:
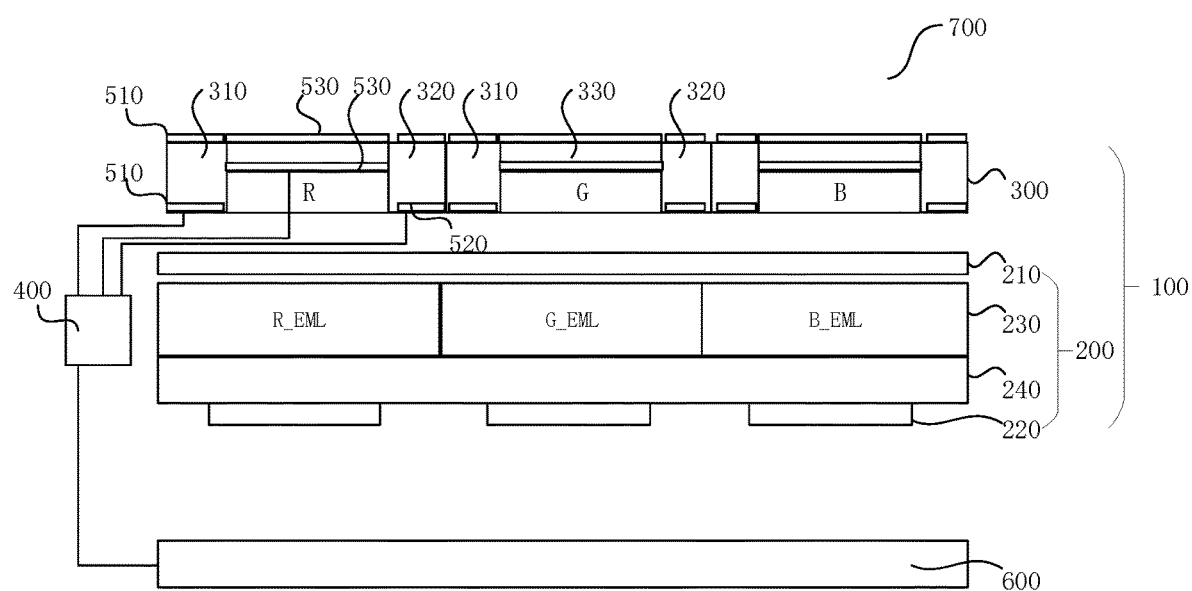
FIG. 15 is a schematic diagram of a display device according to a ninth embodiment of the present application.

As shown in FIG. 15, as a ninth embodiment of this application, a display device 700 is disclosed. The display device 700 includes the display panel 100 as described in any of the above embodiments and driven by the driving method in the above embodiments. The display device 700 further includes a driving circuit 600 connected to the organic light-emitting layer 200 in the display panel 100. The driving circuit 600 is used to control the organic light-emitting layer 200 to emit light. The display device further includes a detection device. The detection device may detect whether the display panel 100 is currently in a stretched state, and may also detect the current display mode of the display panel 100 that includes black state display or bright state display of the entire screen, and state black or bright state display of each pixel. Depending on different detection results, the detection device outputs different control signals to the electrodes of the electric field drive modules corresponding to different electrochromic layers, thereby controlling the electrodes above and below each of the different electrochromic layers to generate different electric fields, and finally causing each of the electrochromic layers to individually form the required color for display.

It should be noted that the limitations of each step involved in this solution are not intended to limit the sequence of the steps as long as the implementation of the specific solution is not affected. For example, detecting the state of the display panel and detecting the display mode of the display panel may be detected simultaneously, or the state of the display panel may be detected first and then the display mode of the display panel is detected, or the display mode of the display panel may be detected first and then the state of the display panel is detected. That is, the steps written earlier may be performed first earlier, later, or even simultaneously as those written later. As long as the solution can be implemented, it should be regarded as falling in the scope of protection of this application.

It should be noted that the inventive concept of this application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing is merely a further detailed description of this application with reference to some specific illustrative embodiments, and the specific implementations of this application are not to be construed to be limited to these illustrative embodiments. For those having ordinary skill in the technical field to which this application pertains, numerous deductions or substitutions may be made without departing from the concept of this application, which shall all be regarded as falling in the scope of protection of this application.

What is claimed is:

1. A driving method of a display panel, the display panel comprising an organic light-emitting layer and a light filter disposed on a light exit surface of the organic light-emitting layer; wherein corresponding to each pixel area, the light filter comprises a color filter, and a first electrochromic layer and a second electrochromic layer disposed respectively on both sides of the color filter; wherein the driving method comprises:

detecting a current state of the display panel; in response to detecting that the current state is a stretched state, controlling the first electrochromic layer and the second electrochromic layer to each become a filter layer having an identical color with that of the corresponding color filter; and in response to detecting that the current state is an unstretched state, controlling the first electrochromic layer and the second electrochromic layer to become opaque;

wherein there is disposed a color-changing material in the first electrochromic layer that is identical with a color-changing material in the second electrochromic layer, and wherein both the color-changing material in the first electrochromic layer and the color-changing material in the second electrochromic layer are each operative to be changed into an identical color with that of the respective color filter or into a black color or transparent under the action of an electric field.

2. The driving method as recited in claim 1, wherein there is further disposed a third electrochromic layer on a side of each color filter facing away from the organic light-emitting layer, and wherein the driving method further comprises:

detecting a current display mode; in response to detecting that a black state is displayed, controlling the first electrochromic layer, the second electrochromic layer, and the third electrochromic layer to become opaque; and in response to detecting that a bright state is displayed, controlling the first electrochromic layer and the second electrochromic layer to become opaque, and controlling the third electrochromic layer to become transparent;

wherein the third electrochromic layer is operative to be changed into a black color or transparent.

3. The driving method as recited in claim 1, wherein there is further disposed a third electrochromic layer on a side of each color filter facing away from the organic light-emitting layer; and wherein the operations of detecting the current state of the display panel; in response to detecting that the current state is a stretched state, controlling the first electrochromic layer and the second electrochromic layer to each become a filter layer having an identical color with that of the corresponding color filter; and in response to detecting that the current state is an unstretched state, controlling the first electrochromic layer and the second electrochromic layer to become opaque comprise:

detecting a current display mode; in response to detecting that a black state is displayed, determining that there is no need to detect a current state of the display panel and directly controlling the first electrochromic layer, the second electrochromic layer, and the third electrochromic layer to become opaque; in response to detecting that a bright state is displayed, detecting the current state of the display panel; in response to detecting that the display panel is currently in a stretched state, controlling the first electrochromic layer and the second electrochromic layer to each become a filter layer having an identical color with that of the corresponding color filter; and in response to detecting that the display panel is currently in an unstretched state, controlling the first electrochromic layer and the second electrochromic layer to become opaque, and controlling the third electrochromic layer to become transparent.

4. The driving method as recited in claim 1, wherein the first electrochromic layer comprises a first color-changing portion and a first light-shielding portion, and wherein the second electrochromic layer comprises a second color-changing portion and a second light-shielding portion; wherein the operations of detecting the current state of the display panel; in response to detecting that the current state is a stretched state, controlling the first electrochromic layer and the second electrochromic layer to each become a filter layer having an identical color with that of the corresponding color filter; and in response to detecting that the current state is an unstretched state, controlling the first electrochromic layer and the second electrochromic layer to become opaque comprise:

detecting the current state of the display panel; in response to detecting that the current state is the stretched state, controlling the first color-changing portion and the second color-changing portion to each become a filter layer having the identical color with that of the corresponding color filter, and controlling the first light-shielding portion and the second light-shielding layer to become opaque; and in response to detecting that the current state is an unstretched state, controlling the first color-changing portion, the first light-shielding portion, the second color-changing portion, and the second light-shielding layer to become opaque.

5. The driving method as recited in claim 1, wherein the light filter comprises a first color filter, a second color filter, and a third color filter having different colors, and wherein the first electrochromic layer and the second electrochromic layer are disposed between two adjacent color filters; wherein the driving method further comprises:

detecting a display mode of every three adjacent pixels; in response to detecting that a middle pixel displays a bright state and the pixels on both sides display a black state, controlling the first electrochromic layer corresponding to the middle pixel and the second electrochromic layer of a corresponding adjacent pixel to each become a filter layer having an identical color with that of the color filter corresponding to the middle pixel, and simultaneously controlling the second electrochromic layer corresponding to the middle pixel and the first electrochromic layer of another corresponding adjacent pixel to each become a filter layer having an identical color with that of the color filter corresponding to the middle pixel.

6. The driving method as recited in claim 5, wherein there is further disposed a third electrochromic layer on a side of each color filter facing away from the organic light-emitting layer; wherein the operations of detecting the display mode of every three adjacent pixels; in response to detecting that a middle pixel displays a bright state and the pixels on both sides display a black state, controlling the first electrochromic layer corresponding to the middle pixel and the second electrochromic layer of a corresponding adjacent pixel to each become a filter layer having an identical color with that of the color filter corresponding to the middle pixel, and simultaneously controlling the second electrochromic layer corresponding to the middle pixel and the first electrochromic layer of a corresponding adjacent pixel to each become a filter layer having an identical color with that of the color filter corresponding to the middle pixel comprise:

detecting the current state of the display panel; in response to detecting that the current state of the display panel is a stretched state, detecting the current display mode;

in response to detecting that any three adjacent pixels are displayed in black state, controlling all the first electrochromic layer, the second electrochromic layer, and the third electrochromic layer of each of the three adjacent pixels to become opaque; and in response to detecting that any three adjacent pixels are displayed in a bright state, controlling the first electrochromic layer and the second electrochromic layer corresponding to each of the three adjacent pixels to each become a filter layer having an identical color with that of the corresponding color filter, and controlling the third electrochromic layer of each of the three adjacent pixels to become transparent.

7. The driving method as recited in claim 1, wherein a pair of transparent electrodes are disposed above and below each of the first electrochromic layer and the second electrochromic layer; wherein voltages of an upper electrode and a lower electrode of the first electrochromic layer are operative to be changed so as to produce a different electric field thus enabling the first electrochromic layer to realize a different color change, and wherein voltages of an upper electrode and a lower electrode of the second electrochromic layer are operative to be changed so as to produce a different electric field thus enabling the second electrochromic layer to realize a different color change.

8. The driving method as recited in claim 4, wherein the operations of detecting the current state of the display panel; in response to detecting that the current state is the stretched state, controlling the first color-changing portion and the second color-changing portion to each become a filter layer having an identical color with that of the corresponding color filter, and controlling the first light-shielding portion and the second light-shielding layer to become opaque; and in response to detecting that the current state is an unstretched state, controlling the first color-changing portion, the first light-shielding portion, the second color-changing portion, and the second light-shielding layer to be become comprise:

detecting a current display mode; in response to detecting that a black state is displayed and the display panel is currently in a stretched state or an unstretched state, controlling the first color-changing portion, the second color-changing portion, the first light-shielding portion, and the second light-shielding layer to become opaque;

in response to detecting that a bright state is displayed and the display panel is currently in a stretched state, controlling the first color-changing portion and the second color-changing portion to each become a filter layer having an identical color with that of the corresponding color filter, and controlling the first light-shielding portion and the second light-shielding portion to become opaque; in response to detecting that the display panel is currently in an unstretched state, controlling the first color-changing portion, the first light-shielding portion, the second color-changing portion, and the second light-shielding layer to become opaque.

9. A display panel, comprising an organic light-emitting layer and a light filter disposed on a light exit surface of the organic light-emitting layer, wherein corresponding to each pixel area, the light filter comprises a color filter, and a first electrochromic layer and a second electrochromic layer that are respectively disposed on both sides of the color filter;

wherein there is disposed a first electric-field driving module corresponding to each first electrochromic layer, and a second electric-field driving module disposed corresponding to each second electrochromic layer; wherein the display panel further comprises a detection module, which is separately connected to both the first electric-field driving module and the second electric-field driving module; wherein the first electric-field driving module is configured to receive a first signal from the detection module to control the first electrochromic layer to realize a color change;

and the second electric-field driving module is configured to receive a second signal from the detection module to control the second electrochromic layer to realize a color change; wherein there is disposed a color-changing material in the first electrochromic layer that is identical with a color-changing material in the second electrochromic layer, and wherein both the color-changing material in the first electrochromic layer and the color-changing material in the second electrochromic layer are each operative to be changed into an identical color with that of the corresponding color filter or into a black color or transparent under the action of an electric field;

wherein the display panel is driven using the following driving method, which comprises:

detecting a current state of the display panel; in response to detecting the current state is a stretched state, controlling the first electrochromic layer and the second electrochromic layer to each become a filter layer having an identical color with that of the corresponding color filter; and in response to detecting that the current state is an unstretched state, controlling the first electrochromic layer and the second electrochromic layer to become opaque.

10. The display panel as recited in claim 9, wherein there is further disposed a third electrochromic layer on a side of each color filter facing away from the organic light-emitting layer, and wherein there is further disposed a third electric-field driving module corresponding to the third electrochromic layer, and wherein the detection module is connected to the third electric-field driving module; wherein the third electric-field driving module is configured to receive a third signal from the detection module to control the third electrochromic layer to realize a color change;

wherein the first electric-field driving module, the second electric-field driving module, and the third electric-field driving module each comprise two oppositely arranged transparent electrodes; wherein the electrochromic layer corresponding to each of the first electric-field driving module, the second electric-field driving module, and the third electric-field driving module is sandwiched in the corresponding two electrodes; and wherein a distance between the two transparent electrodes corresponding to the first electric-field driving module is equal to a distance between the two transparent electrodes corresponding to the second electric-field driving module, and is greater than or equal to a sum of a distance between the two transparent electrodes of the third electric-field driving module and a thickness of the corresponding color filter;

wherein the third electrochromic layer is operative to be changed into a black color or transparent, and wherein the first electrochromic layer and the second electrochromic layer are each doped with a metal material having a ductility that is greater than a preset threshold.

11. The display panel as recited in claim 9, wherein the first electrochromic layer comprises a first color-changing portion and a first light-shielding portion, and wherein the second electrochromic layer comprises a second color-changing portion and a second light-shielding portion; and wherein there is disposed an electrochromic material or black opaque material in each of the first light-shielding portion and the second light-shielding portion.

12. The display panel as recited in claim 9, wherein the display panel is a stretchable display panel, and wherein the first electrochromic layer and the second electrochromic layers are stretchable.

13. The display panel as recited in claim 11, wherein there are disposed transparent electrodes above and below each of the first color-changing portion and the second color-changing portion; and wherein the first light-shielding portion and the second light-shielding portion are each formed using a black electrochromic layer, wherein there is disposed no transparent electrodes above and below the black electrochromic layer.

14. The display panel as recited in claim 11, wherein there are disposed transparent electrodes above and below each of the first color-changing portion and the second color-changing portion; and wherein the first light-shielding portion and the second light-shielding portion are each formed using a black electrochromic layer, and there are disposed transparent electrodes above and below the black electrochromic layer.

15. The display panel as recited in claim 11, wherein the first electrochromic layer or the second electrochromic layer comprises a part that is correspondingly disposed on an upper side above the anode and that is adaptable to a stretched size of the anode, and another part that has no tensile elasticity and that maintains a black and opaque state.

16. The display panel as recited in claim 9, wherein the light filter comprises a first color filter, a second color filter, and a third color filter having different colors, and wherein the first electrochromic layer and the second electrochromic layer are disposed between two adjacent color filters.

17. A display device, comprising a display panel and a driving circuit, the driving circuit being used to drive the display panel, the display panel comprising an organic light-emitting layer and a light filter being disposed on a light exit surface of the organic light-emitting layer; wherein corresponding to each pixel area, the light filter comprises a color filter, and a first electrochromic layer and a second electrochromic layer that are disposed respectively on both sides of the color filter;

wherein there is disposed a first electric-field driving module corresponding to each first electrochromic layer, and a second electric-field driving module corresponding to each second electrochromic layer; wherein the display panel further comprises a detection module connected separately to both the first electric-field driving module and the second electric-field driving module; wherein the first electric-field driving module is configured to receive a first signal from the detection module to control the first electrochromic layer to realize a color change, and the second electric-field driving module is configured to receive a second signal from the detection module to control the second electrochromic layer to realize a color change;

wherein there is disposed a color-changing material in the first electrochromic layer that is identical with a color-changing material in the second electrochromic layer, and wherein both the color-changing material in the first electrochromic layer and the color-changing material in the second electrochromic layer are each operative to be changed into an identical color with that the respective color filter or into a black color or transparent under the action of an electric field.

18. The display device as recited in claim 17, further comprising a detection device configured to detect whether the display panel is currently in a stretched state, detect a current display mode of the display panel, and output different control signals to electrodes of the electric-field driving modules corresponding to different electrochromic layers depending on different detection results, thereby controlling the electrodes above and below each of the different electrochromic layers to generate a different electric field, and finally causing the electrochromic layer to form a required color for display.

19. The display device as recited in claim 17, wherein the first electrochromic layer comprises a first color-changing portion and a first light-shielding portion, and the second electrochromic layer comprises a second color-changing portion and a second light-shielding portion; wherein there is disposed an electrochromic material or black opaque material in each of the first light-shielding portion and the second light-shielding portion;

wherein there are disposed transparent electrodes above and below each of the first color-changing portion and the second color-changing portion; wherein the first light-shielding portion and the second light-shielding portion are each formed using a black electrochromic layer, and there is disposed no transparent electrodes above and below the black electrochromic layer.

20. The display device as recited in claim 17, wherein the display panel is a stretchable display panel, and wherein the first electrochromic layer and the second electrochromic layer are stretchable; wherein the first electrochromic layer or the second electrochromic layer comprises a part that is correspondingly disposed on an upper side above the anode and that is adaptable to a stretched size of the anode, and another part that has no tensile elasticity and that maintains a black and opaque state.

\* \* \* \* \*